United States Patent
Gardner et al.

(10) Patent No.: US 12,336,270 B2
(45) Date of Patent: Jun. 17, 2025

(54) HIGH PERFORMANCE NEW CHANNEL MATERIALS PRECISION ALIGNED 3D CFET DEVICE ARCHITECTURE

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 433 days.

(21) Appl. No.: 17/666,249

(22) Filed: Feb. 7, 2022

(65) Prior Publication Data

US 2023/0253259 A1    Aug. 10, 2023

(51) Int. Cl.
| | |
|---|---|
| *H01L 21/8238* | (2006.01) |
| *H01L 27/092* | (2006.01) |
| *H10D 84/01* | (2025.01) |
| *H10D 84/03* | (2025.01) |
| *H10D 84/85* | (2025.01) |
| *H01L 25/065* | (2023.01) |

(52) U.S. Cl.
CPC ....... *H10D 84/017* (2025.01); *H10D 84/0167* (2025.01); *H10D 84/0172* (2025.01); *H10D 84/0186* (2025.01); *H10D 84/038* (2025.01); *H10D 84/856* (2025.01); *H01L 25/0657* (2013.01)

(58) Field of Classification Search
CPC ............ H01L 27/0922; H01L 25/0657; H10D 30/0316; H10D 30/6732; H10D 86/432; H10D 30/6755
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2006/0079034 A1* | 4/2006 | Hoffman | H01L 29/66969 438/151 |
| 2016/0020228 A1* | 1/2016 | Jiang | H01L 27/1288 257/43 |
| 2020/0075489 A1* | 3/2020 | Liebmann | H01L 21/8221 |
| 2020/0219877 A1* | 7/2020 | Then | H01L 27/1203 |
| 2021/0359099 A1* | 11/2021 | Shen | H01L 29/45 |

* cited by examiner

*Primary Examiner* — John A Bodnar
(74) *Attorney, Agent, or Firm* — Foley & Lardner LLP

(57) ABSTRACT

A method for manufacturing a semiconductor device is described. The method includes forming a first complementary field effect transistor. The first complementary field effect transistor has a first transistor of a first conductivity type, and a second transistor of a second conductivity above the first transistor. The first transistor includes a first gate electrode, a first channel above the first gate electrode, and first source and drain contacts above the first channel layer. The second transistor includes a second gate electrode, a second channel, and second source and drain contacts. The second channel is disposed between the second source and drain contacts and the second gate electrode. At least one of the first channel or the second channel includes a two-dimensional semiconductor material or an oxide semiconductor.

20 Claims, 17 Drawing Sheets

HIGH PERFORMANCE NEW CHANNEL MATERIALS PRECISION ALIGNED 3D CFET DEVICE ARCHITECTURE

TECHNICAL FIELD

The present disclosure relates generally to the field of manufacturing semiconductor devices.

BACKGROUND

In the manufacture of semiconductor devices, various fabrication processes are executed, such as film-forming depositions, etch mask creation, patterning, material etching and removal, and doping treatments. These processes may be performed to form semiconductor device components on a substrate. Some example fabrication techniques allow the manufacture of transistors on a single active device plane, while wiring or metallization is formed above the active device plane. Such devices are accordingly characterized as two-dimensional (2D) circuits, manufactured using 2D fabrication techniques.

SUMMARY

The structure and methods described herein may provide a low process temperature three-dimensional stack that is aligned and may contain N-type metal oxide semiconductor (NMOS) and P-type metal oxide semiconductor (PMOS) devices for a complimentary field effect transistor (CFET). By using the gate electrode as the initial device geometry, a precision three-dimensional (3D) stack of the channel and gate regions may be achieved. The channel may be formed of either 2D semiconductor materials and/or oxide semiconductors, which may be either in enhancement or depletion mode depending on anneal conditions.

The device structure may be flexible based on the planarity of the 3D device stack build. For example, the CFET structures may be arranged to be stacked N CFET structures high, where N is 2 or more. Side-by-side structures of CFET structures are also possible. Embodiments are not limited to CFET as device structures, and inverters and pass transistors are also contemplated.

The method is flexible and does not require epitaxial silicon on the base substrate, so any base material may be possible. Further, the low temperature processes possible for the method allow for transistors at any place in the process flow, such as in the backend processes of the overall device. Complete transistor process flows are possible with a reduced number of process steps with aligned spacers for channel and gate dielectric regions.

In one embodiment, a method for manufacturing a semiconductor device may comprise forming a first complementary field effect transistor structure comprising forming a first transistor structure of a first conductivity type, the first transistor structure including a first gate electrode, first source/drain contacts, and a first channel disposed between the first gate electrode and the first source/drain contacts; forming a dielectric above the first transistor structure; and forming a second transistor of a second conductivity type above the dielectric, the second transistor including a second gate electrode, second source/drain contacts, and a second channel disposed between the second gate electrode and the second source/drain contacts, wherein at least one of the first channel or the second channel includes a two-dimensional semiconductor material or an oxide semiconductor.

The method may further comprise forming a first gate dielectric on the first gate electrode and a second gate dielectric on the second gate electrode. The first channel may include a two-dimensional semiconductor material, and the second channel may include a two-dimensional semiconductor material. The first channel may include an oxide semiconductor, and the second channel may include an oxide semiconductor. The first channel may include an oxide semiconductor, and the second channel may include a two-dimensional semiconductor material.

The method may further comprise forming a second complementary field effect transistor disposed vertically from the first complementary field effect transistor, wherein forming the second complementary field effect transistor comprises: forming a third transistor structure of a first conductivity type, the first transistor structure including a third gate electrode, third source/drain contacts, and a third channel disposed between the third gate electrode and the third source/drain contacts; and forming a fourth transistor of a second conductivity type above the third transistor structure, the fourth transistor including a fourth gate electrode, fourth source/drain contacts, and a fourth channel disposed between the fourth gate electrode and the fourth source/drain contacts.

The method may further comprise forming a second complementary field effect transistor disposed horizontally from the first complementary field effect transistor, wherein forming the second complementary field effect transistor comprises: forming a third transistor structure of a first conductivity type, the first transistor structure including a third gate electrode, third source/drain contacts, and a third channel disposed between the third gate electrode and the third source/drain contacts; and forming a fourth transistor of a second conductivity type above the third transistor structure, the fourth transistor including a fourth gate electrode, fourth source/drain contacts, and a fourth channel disposed between the fourth gate electrode and the fourth source/drain contacts.

The two-dimensional semiconductor material may include at least one of $WS_2$, $WSe_2$, $WTe_2$, $MoS_2$, $MoSe_2$, $MoTe_2$, $HfS_2$, $ZrS_2$, $TiS_2$, GaSe, InSe, phosphorene, graphene, HBN, $HfSe_2$, $ZrSe_2$, or $HfZrSe_2$. The oxide semiconductor may include $In_2O_3$, $SnO_2$, InGaZnO, ZnO, or SnO.

The method may further comprise forming buried power rails, wherein the first gate electrode is formed above the buried power rails.

In another embodiment, a method for manufacturing a semiconductor device may comprise forming a first gate electrode; forming a first gate dielectric above the first gate electrode; forming a first channel above the first gate dielectric, wherein the first channel includes a two-dimensional semiconductor material or an oxide semiconductor; forming a first source contact and a first drain contact above the first channel; forming a dielectric above the first source contact the first drain contact; forming a second gate electrode above the dielectric; forming a second gate dielectric above the second gate electrode; and forming a second channel above the second gate dielectric, wherein the second channel includes a two-dimensional semiconductor material or an oxide semiconductor; forming a second source contact and a second drain contact above the second channel.

The method may further comprise forming a dielectric cap layer above the dielectric, wherein the second gate electrode is formed on the dielectric cap layer.

The method may further comprise forming a third gate electrode above the second source contact and the second drain contact; forming a third gate dielectric above the third gate electrode; forming a third channel above the third gate dielectric, wherein the third channel includes a two-dimensional semiconductor material or an oxide semiconductor; forming a third source contact and a third drain contact above the third channel; forming a second dielectric above the third source contact the third drain contact; forming a fourth gate electrode above the second dielectric; forming a fourth gate dielectric above the fourth gate electrode; forming a fourth channel above the fourth gate dielectric, wherein the fourth channel includes a two-dimensional semiconductor material or an oxide semiconductor; and forming a fourth source contact and a fourth drain contact above the fourth channel.

The method may further comprise forming a third gate electrode planar with the first gate electrode; forming the first gate dielectric above the third gate electrode; forming a third source contact and a third drain contact above the first channel; forming a fourth gate electrode planar with the second gate electrode above the dielectric; and forming a fourth source contact and a fourth drain contact above the second channel.

In yet another embodiment, a semiconductor device may comprise a first complementary field effect transistor including: a first transistor structure of a first conductivity type, the first transistor structure including a first gate electrode, first source/drain contacts, and a first channel disposed between the first gate electrode and the first source/drain contacts; a dielectric above the first transistor structure; and a second transistor of a second conductivity type above the dielectric, the second transistor including a second gate electrode, second source/drain contacts, and a second channel disposed between the second gate electrode and the second source/drain contacts, wherein at least one of the first channel or the second channel includes a two-dimensional semiconductor material or an oxide semiconductor.

The first channel may include a two-dimensional semiconductor material, and the second channel may include an oxide semiconductor. The first channel may include a two-dimensional semiconductor material, and the second channel may include a two-dimensional semiconductor material. The device may comprise a vertical stack of N complementary field effect transistors, wherein N is an integer of 2 or more, each complementary field effect transistor having a structure of the first complementary field effect transistor. The device may comprise a second complementary field effect transistor having a structure of the first complementary field effect transistor, the second complementary field effect transistor disposed horizontally from the first complementary field effect transistor. The device may comprise buried power rails electrically connected to, and disposed below, the first transistor structure.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings.

DETAILED DESCRIPTION

Figure 1:
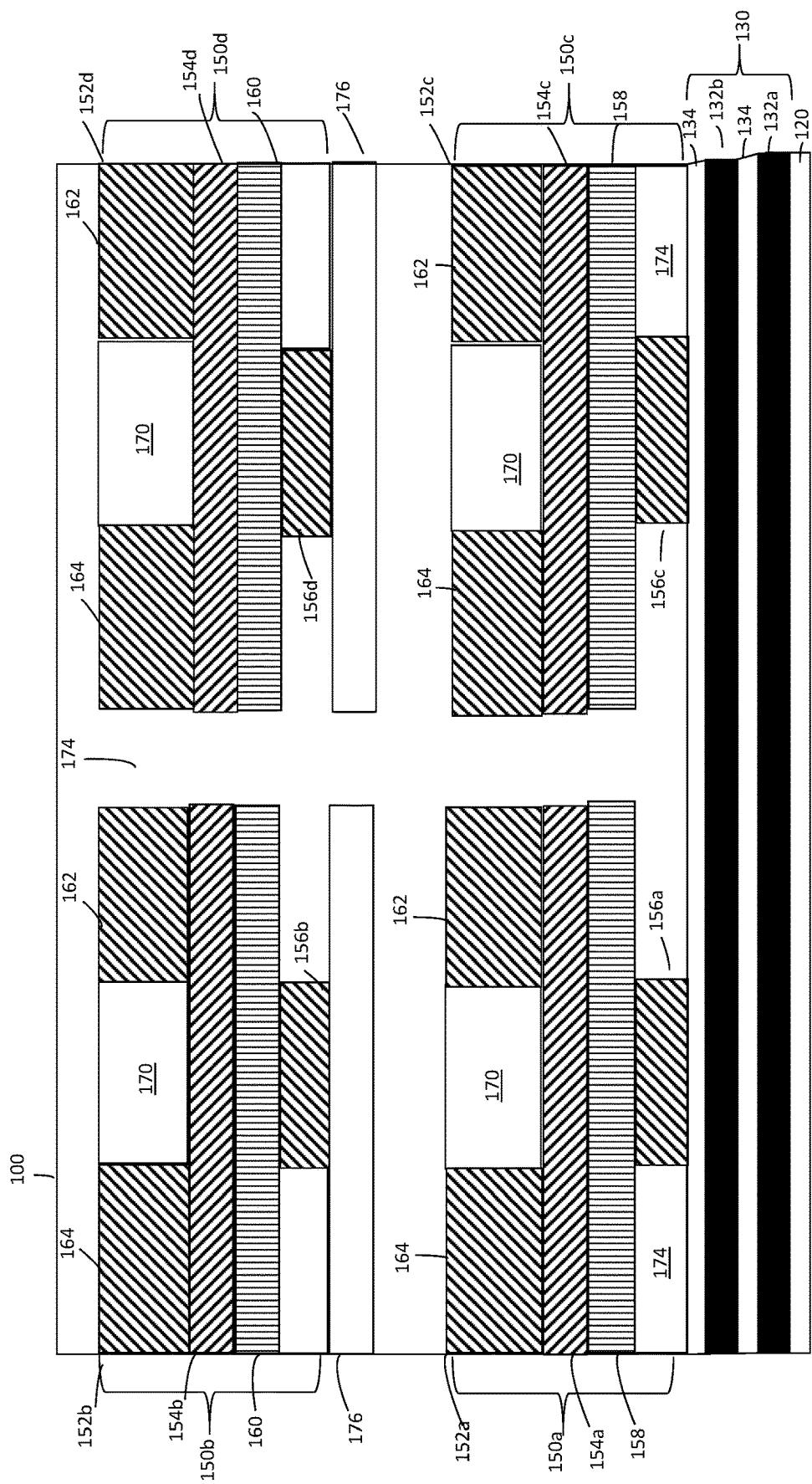
FIG. 1 illustrates a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Reference will now be made to the figures, which for the convenience of visualizing the fabrication techniques described herein, illustrate a substrate undergoing a process flow. Unless expressly indicated otherwise, each Figure represents one (or a set) of fabrication steps in a process flow for manufacturing the devices described herein. In the views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein.

FIG. 1 illustrates a cross-sectional view of a semiconductor device 100 according to at least one embodiment. The device 100 includes a base substrate 120, upon which is formed a base wiring 130. The base wiring 130 includes buried power rails (BPRs) 132*a* and 132*b* with dielectric layers 134. The dielectric layers 134 insulate the BPRs 132*a* and 132*b* from each other, and from gate electrodes 156. The dielectric layers 134 may be formed of silicon oxide and/or silicon nitride, for example. The BPR 132*a* and BPR 132*b* may function to respectively provide a ground (Grd) voltage and Vdd voltage to overlying transistor elements or other circuit elements, such as CFETs. While FIG. 1 illustrates two BPRs 132a and 132b, the number of BPRs may be more than 2, for example. FIG. 1 illustrates the BPRs underneath the lower transistors 150a and 150c. Alternatively, or in addition to, the BPRs may be arranged between the lower transistors 150a and 150c and the upper transistors 150b and 150d. The BPRs may be under the CFETs, described below.

FIG. 1 illustrates a four component device 100 with two NMOS devices and two PMOS devices. In general, the number of components may be less than or more than four. The components may include transistors, either NMOS or PMOS, inverters, or pass transistors, for example. FIG. 1 illustrates an example where the components are transistors 150 including a first transistor 150a (NMOS) with a top surface 152a, second transistor 150b (PMOS) with a top surface 152b, third transistor 150c (NMOS) with a top surface 152c and fourth transistor 150d (PMOS) with a top surface 152d. The first transistor 150a and second transistor 150b together are part of a complimentary field effect transistor (CFET). Likewise, the third transistor 150c and the fourth transistor 150d together are part of another CFET. The BPRs may be disposed under the CFETs. The CFETs, and their transistors, may be horizontally or laterally arranged relative to each other. Each transistor 150, i.e., transistors 150a, 150b, 150c and 150d, has a corresponding gate electrode 156 (first gate electrode 156a, second gate electrode 156b, third gate electrode 156c or fourth gate electrode 156d) and a channel 154 (first channel 154a, second channel 154b, third channel 154c or fourth channel 154d). The first transistor 150a has the first gate electrode 156a, the second transistor 150b has the second gate electrode 156b, the third transistor 150c has the third gate electrode 156c, and the fourth transistor 150d has the fourth gate electrode 156d. Further, each transistor 150 includes a gate dielectric 160, a source contact 162, and a drain contact 164. Each channel 154 is disposed between respective source contacts 162 and drain contacts 164, and gate electrode 156. Further, the gate dielectric 160 is disposed between second gate electrode 156b and second channel 154b, and between fourth gate electrode 156d and the fourth channel 154d. A gate dielectric 158 is disposed between first gate electrode 156a and first channel 154a, and between third gate electrode 156c and third channel 154c.

As illustrated in FIG. 1, the transistors have a top surface 152 (first top surface 152a, second top surface 152b, third top surface 152c, or fourth top surface 152d). Each transistor 150 is arranged in an inverted arrangement where the gate electrode 156 is located at the bottom of its transistor 150, while the source and drain contacts 162 and 164 are arranged at the top. Alternatively, the gate 156 may be located at the top of its transistor 150, and the source and drain contacts 162 and 164 are arranged at the bottom of their transistor 150, as long as the top surface 152 of a respective transistor 150 is planarized. The planarization provides for ease of, and flexibility for, stacking of the transistors 150 in a stacked arrangement. While the CFET structures of coupled NMOS and PMOS structures are not vertically stacked in FIG. 1, arrangements are contemplated where CFET structures are vertically stacked in arrangements of N CFETs where N is an integer of 2 or more (see FIG. 17). In this case, a second CFET being of a same structure as a first CFET is arranged above the first CFET.

The transistors 150 may be electrically isolated via an isolation dielectric 174 which separates the transistors 150 from one another. Further, a dielectric layer 170 is arranged to separate the source and drain contacts 162, 164 from each other. Still further, a dielectric cap layer 176 is arranged under the second transistor 150b and under the fourth transistor 150d. The structure may be aligned, such that the gate electrodes 156 are aligned with the respective channels 154. Thus, the number of process steps may be reduced by including the alignment process.

FIGS. 2-15 illustrate the device 100 in steps of formation according to a process flow.

Figure 2:
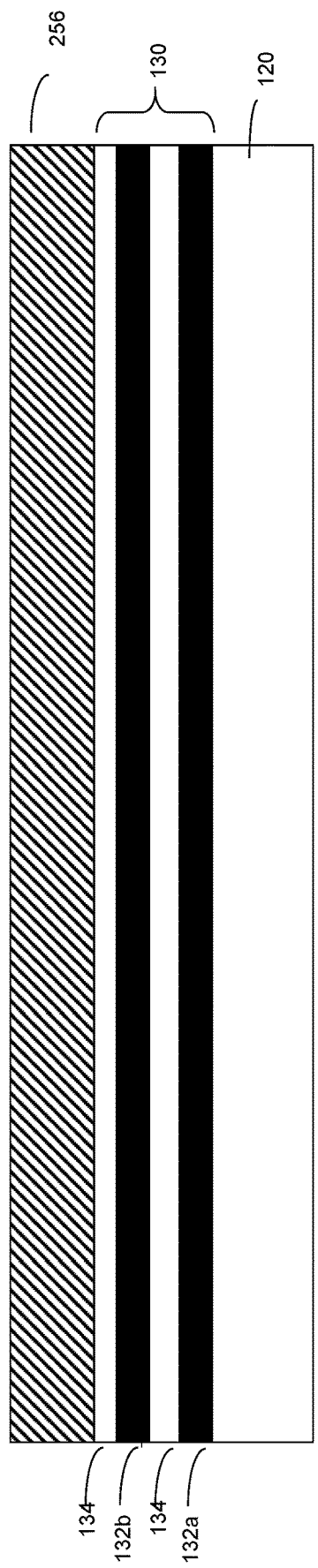
FIGS. 2-16 show cross-sectional views of a semiconductor device being manufactured at different stages of the process of making the semiconductor device of FIG. 1, in accordance with some embodiments.

Referring to FIG. 2, a base substrate 120 may be a dielectric substrate (e.g., silicon nitride). The base substrate 120 may be a semiconductor substrate, such as a bulk semiconductor, a semiconductor-on-insulator (SOI) substrate, or the like, which may be doped (e.g., with a p-type or an n-type dopant) or undoped. The base substrate 120 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate, may also be used. In some embodiments, the semiconductor material of the base substrate 120 may include silicon; germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The base wiring 130, including the dielectric layers 134 and BPRs 132a and 132b, are formed on the base substrate 120 in the order of BPR 132a, dielectric layer 134, BPR 132b and another dielectric layer 134.

The dielectric layers 134 may be formed over the base substrate 120. The dielectric layers 134 may be any type of dielectric material that is capable of being disposed, patterned, or otherwise provided on top of the base substrate 120. Some examples of dielectric materials can include, but are not limited to, $SiO_2$ or $SiO_xN_y$, other oxide materials, SiN, and others.

In various embodiments, the dielectric layers 134 may be deposited over the base substrate 120. For example, the dielectric layers 134 may be grown by a molecular beam epitaxy (MBE) process, a chemical vapor deposition (CVD) process, such as a metal organic CVD (MOCVD) process, a furnace CVD process, and/or other suitable deposition processes. In other embodiments, the dielectric layer 134 may be grown using an atomic layer deposition (ALD) process.

The BPR layers 132a and 132b may be formed by deposition of a metal, for example, followed by patterning, as needed. The patterning may be performed using an etch mask, and then an appropriate etch to etch the metal through the etch mask. The etch mask may then be removed. A gate layer 256, of an electrode material, may be deposited on the top of the dielectric layer 134.

Figure 3:
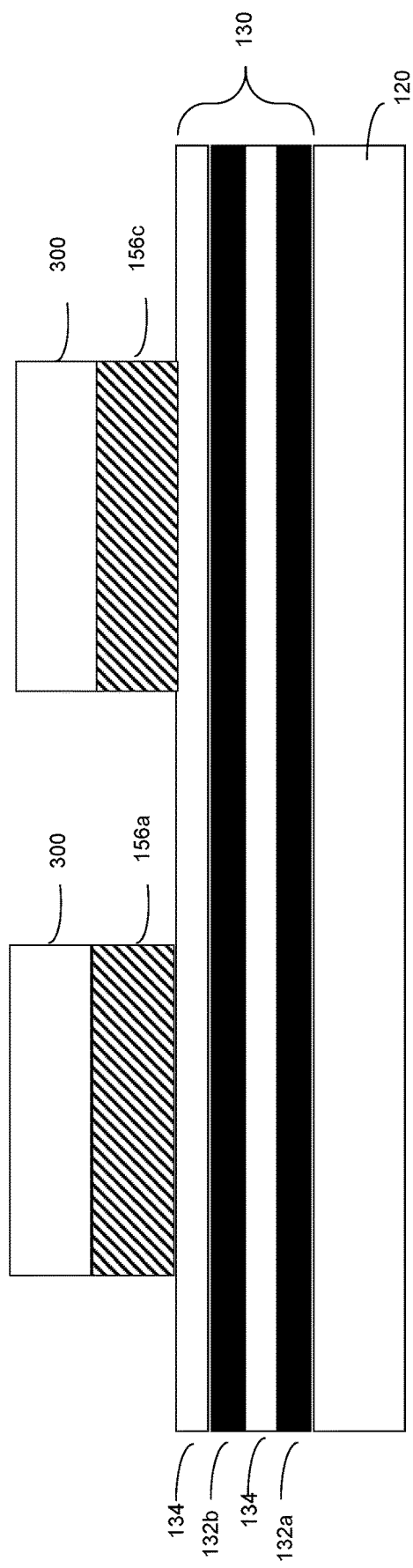

Referring to FIG. 3, the formation of the first gate electrode 156a and third gate electrode 156c is described. The electrode material is deposited on the top dielectric layer 134 of the base wiring 130, where the electrode material is a conductive material, such as a metal or doped polycrystalline silicon. A material for the gate metal of the gate electrode 156 for a P-type device may be selected to be different from the gate layer of an N-type device. A non-exhaustive list of potential materials to use for the gate electrode includes ruthenium (Ru), tantalum nitride (TaN), titanium nitride (TiN), tungsten (W), tungsten nitride (WN), titanium carbide (TiC), gallium (Ga), gadolinium (Gd), titanium oxynitride (TiON), tantalum silicon nitride (Ta- SiN), titanium silicon nitride (TiSiN), molybdenum (Mo), aluminum (Al), copper (Cu) and combinations/stacks/alloys of these or similar materials.

Patterning of the gate electrode may be formed by, for example, a photolithographic process. Photoresist (e.g., a positive photoresist or a negative photoresist), for example, may be deposited on the electrode material. The photoresist is irradiated with light and developed to form a photoresist mask 300 over the electrode material.

The electrode material is then etched to form the first and third gate electrodes 156a and 156c, In some embodiments, etching may be an anisotropic etch (e.g., a reactive ion etch (RIE), neutral beam etch (NBE), deep reactive ion etch (DRIE), and the like, or combinations thereof), which selectively etches the exposed portions of layers in the vertical direction.

Figure 4:
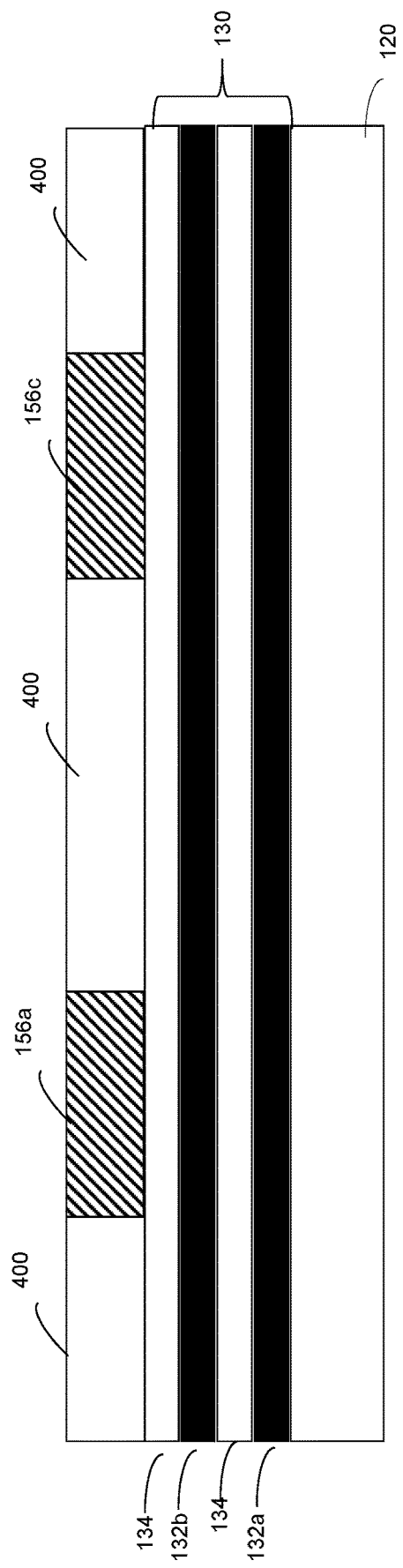

Referring to FIG. 4, an isolation dielectric 400 is formed between the first and third gate electrodes 156a and 156c. A dielectric material is deposited on the first and third gate electrodes 156a and 156c. The dielectric material may be formed by depositing isolation materials (e.g., SiO, $SiO_2$ or $SiO_xN_y$). After the dielectric material is deposited, a top portion of the dielectric material may be polished by using, e.g., chemical-mechanical polishing (CAR)) to flatten a top surface of the semiconductor device including the isolation dielectric 400 and the first and third gate electrodes 156a and 156c, and to remove the dielectric material from the top of the first and third gate electrodes 156a and 156c.

Figure 5:
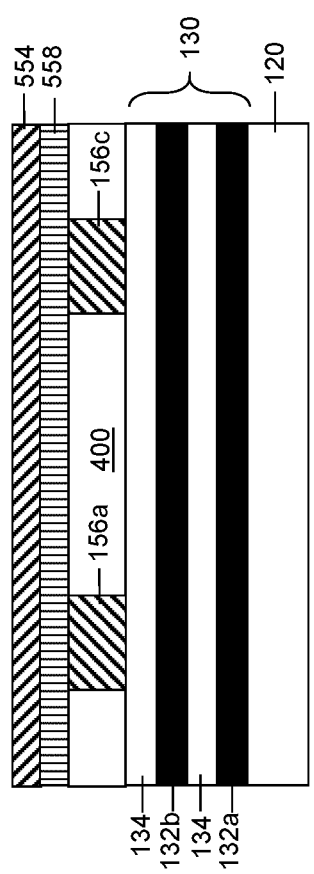

Referring to FIG. 5, a gate dielectric layer 558 is formed over the isolation dielectric 400 and over the first and third gate electrodes 156a and 156c. A channel layer 554 is formed on the gate dielectric layer 558.

The gate dielectric layer 558 may be, for example, a high-k dielectric. The high-k dielectric can be any type of material that has a relatively large dielectric constant (e.g., having a dielectric constant greater than 3.9). The high-k dielectric material may be, for example, silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof.

The high-k dielectric material may be grown by thermal oxidization (e.g., annealing). In some embodiments, the high-k dielectric material may be deposited as a blanket layer over the semiconductor device 100. For example, the high-k dielectric material may cover a top surface of the gate electrodes 156a and 156c and the isolation dielectric 400. The high-k dielectric material may be deposited as a blanket layer using any of the methods of atomic layer deposition (ALD), chemical vapor deposition (CVD), physical vapor deposition (PVD), evaporation, electrodeposition, sputtering, plasma-enhanced techniques, etc.

The channel layer 554 may be a 2D semiconductor material or an oxide semiconductor, for example. The 2D material may be, for example, at least one of $WS_2$, $WSe_2$, $WTe_2$, $MoS_2$, $MoSe_2$, $MoTe_2$, $HfS_2$, $ZrS_2$, $TiS_2$, GaSe, InSe, phosphorene, graphene, HBN, $HfSe_2$, $ZrSe_2$, or $HfZrSe_2$. The 2D material may be formed by, for example, ALD, CVD, PVD, evaporation, electrodeposition, sputtering, plasma-enhanced techniques, etc. The deposited 2D material may be, for example, about 5 to about 15 angstroms thick, the thinness lending to their name—2D material. The materials may be annealed during or after the device formation process to recrystallize or grow the crystals, thereby improving electrical characteristics. For the sake of simplicity, the use of conductive dielectrics is disclosed hereinbelow. An annealing may be included to set the 2D material as appropriate for an NMOS device or a PMOS device to provide for being an enhancement mode or depletion mode transistor.

Certain materials, when combined with oxygen, may form new materials that exhibit semiconductor properties (e.g., can turn "off" with low off-state leakage current or can become highly conductive under certain circumstances). Some examples of an N-type oxide semiconductor include $In_2O_3$, $SnO_2$, InGaZnO, and ZnO. One example of a P-type conductive channel is SnO. The oxide semiconductor material may be formed by, for example, ALD, CVD, PVD, evaporation, electrodeposition, sputtering, plasma-enhanced techniques, etc.

The first gate electrode 156a and third gate electrode 156c may be aligned with the channel layer 554.

Figure 6:
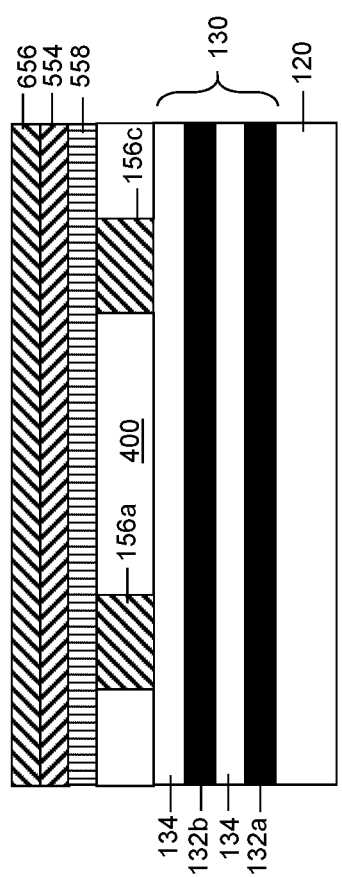

Referring to FIG. 6, a source/drain layer 656 is formed on the channel layer 554. The source/drain layer 656 may be any type of conductive metal suitable to form a source or drain electrode in the semiconductor device 100, including copper, gold, silver, platinum, nickel, tungsten, ruthenium, or other types of conductive metals or alloys. The deposition or addition of the source/drain layer 656 may be performed using any type of material deposition technique, including but not limited to ALD, CVD, physical vapor deposition (PVD), evaporation, electrodeposition, and sputtering.

Figure 7:
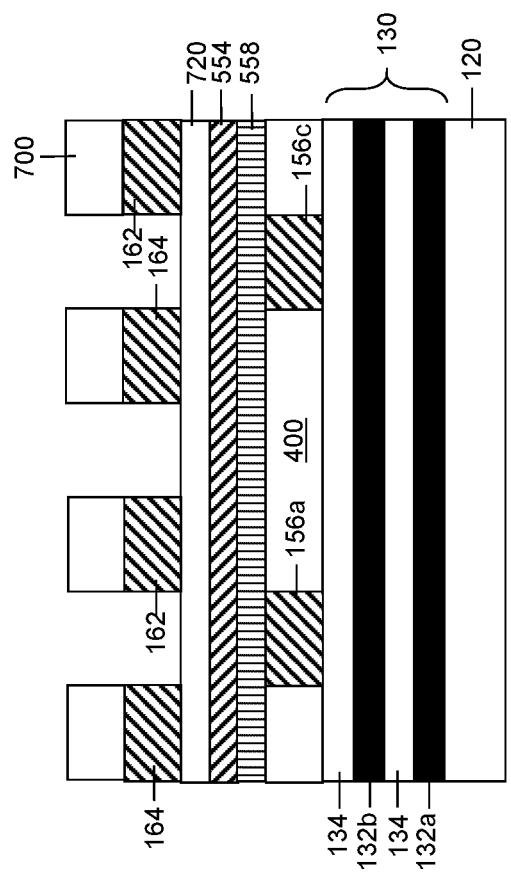

Referring to FIGS. 6 and 7, a photoresist mask 700 is formed on the source/drain layer 656. Patterning of the source/drain layer 656 may be formed by, for example, a photolithographic process. Photoresist (e.g., a positive photoresist or a negative photoresist), for example, may be deposited on the source/drain layer 656. The photoresist is irradiated with light and developed to form a photoresist mask 700 over the source/drain layer 656.

The source/drain layer 656 is then etched to form the source contacts 162 and drain contacts 164, In some embodiments, etching may be an anisotropic etch (e.g., a reactive ion etch (RIE), neutral beam etch (NBE), deep reactive ion etch (DRIE), and the like, or combinations thereof) which selectively etches the exposed portions of layers in the vertical direction. The etching exposes the channel layer 554. The photoresist mask 700 may then be removed.

Prior to etching the source/drain layer 656, a protective conducting oxide layer 720 may be formed on the channel layer 554, in some embodiments. Optionally, the protective conducting oxide layer 720 may be omitted, and thus is shown only in FIG. 7. During the etching in FIG. 7 of the source/drain layer 656, the protective conducting oxide layer 720 may be exposed to etchant and protects the channel layer 554 from being exposed to etchant. The protective conducting oxide layer 720 may be indium tin oxide, for example.

Figure 8:
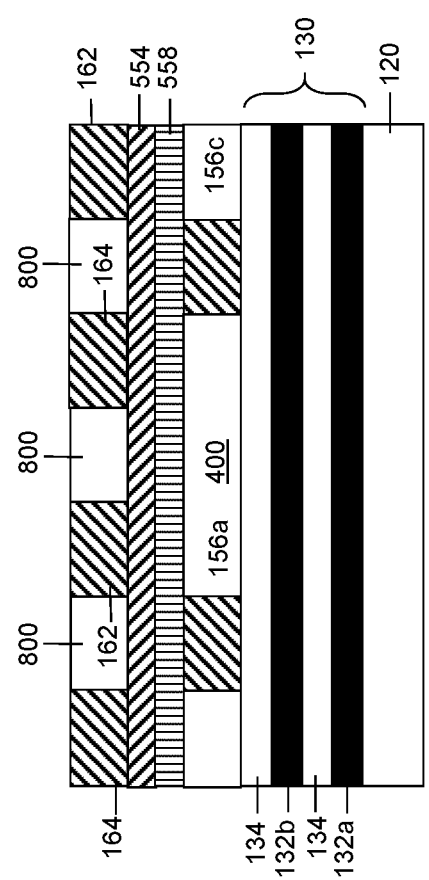

Referring to FIG. 8, a dielectric 800 is formed between the source contacts 162 and drain contacts 164. A dielectric material is deposited on the source contacts 162 and drain contacts 164. The dielectric material may be formed by depositing isolation materials (e.g., SiO, $SiO_2$ or $SiO_xN_y$). After the dielectric material is deposited, a top portion of the dielectric material may be polished by using, e.g., chemical-mechanical polishing (CMP) (i) to flatten a top surface of the semiconductor device including the dielectric 800 and the source contacts 162 and drain contacts 164, and (ii) to remove the dielectric material from the top of the source contacts 162 and drain contacts 164.

Figure 9:
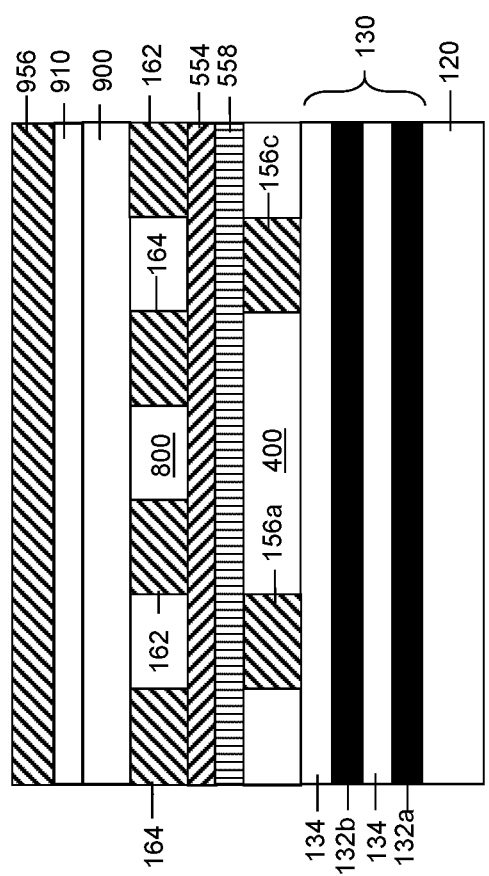

Referring to FIG. 9, an isolation dielectric layer 900, a dielectric cap layer 910, and a gate electrode layer 956 are formed. The isolation dielectric layer 900 is formed on the dielectric 800 and on the source contacts 162 and drain contacts 164. A dielectric material is deposited on the dielectric 800 and on the source contacts 162 and drain contacts 164. The dielectric material may be formed by depositing isolation materials (e.g., SiO, $SiO_2$ or $SiO_xN_y$). The dielectric cap layer 910 may include any of the dielectric materials discussed with respect to isolation dielectric layer 900.

The gate electrode layer 956 is formed of an electrode material. The electrode material is deposited on the dielectric cap layer 910, where the electrode material is a conductive material, such as a metal or doped polycrystalline silicon. A material for the gate metal of the gate electrode layer 956 for a P-type device may be selected to be different from the gate layer of an N-type device. A non-exhaustive list of potential materials to use for the gate layer includes ruthenium (Ru), tantalum nitride (TaN), titanium nitride (TiN), and tungsten (W), tungsten nitride (WN), titanium carbide (TiC), gallium (Ga), gadolinium (Gd), titanium oxynitride (TiON), tantalum silicon nitride (TaSiN), titanium silicon nitride (TiSiN), molybdenum (Mo), aluminum (Al), copper (Cu) and combinations/stacks/alloys of these or similar materials.

Figure 10:
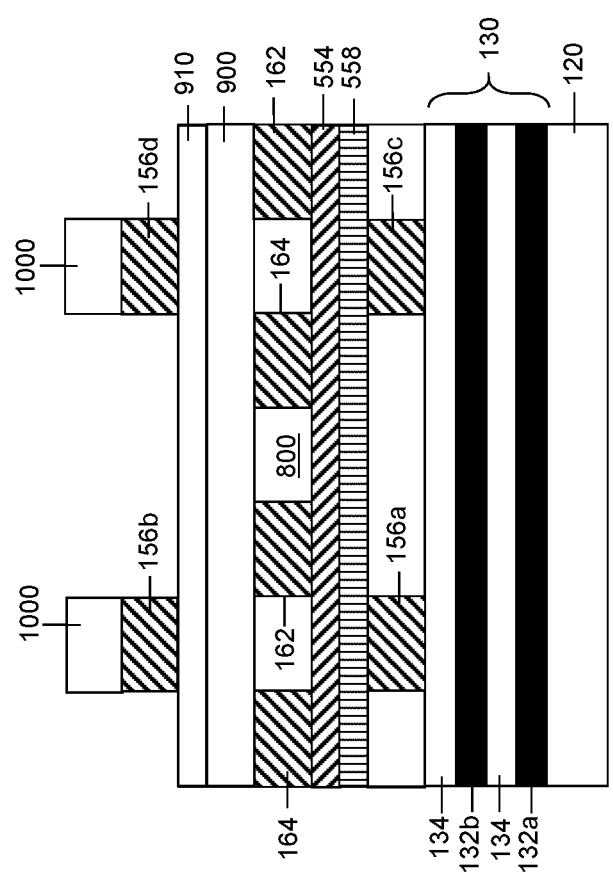

Referring to FIG. 10, the formation of the second gate electrode 156b and fourth gate electrode 156d is described. An electrode material is deposited on the cap layer 910, where the electrode material is a conductive material such as a metal or doped polycrystalline silicon. A material for the gate metal of the gate electrode 156 for a P-type device may be selected to be different from the gate layer of an N-type device. A non-exhaustive list of potential materials to use for the gate layer includes ruthenium (Ru), tantalum nitride (TaN), titanium nitride (TiN), and tungsten (W), tungsten nitride (WN), titanium carbide (TiC), gallium (Ga), gadolinium (Gd), titanium oxynitride (TiON), tantalum silicon nitride (TaSiN), titanium silicon nitride (TiSiN), molybdenum (Mo), aluminum (Al), copper (Cu) and combinations/stacks/alloys of these or similar materials.

Patterning of the gate electrode 156 may be formed by, for example, a photolithographic process. Photoresist (e.g., a positive photoresist or a negative photoresist), for example, may be deposited on the electrode material. The photoresist is irradiated with light and developed to form a photoresist mask 1000 over the electrode material.

The conductive material is then etched to form the second and fourth gate electrodes 156b and 156d. In some embodiments, etching may be an anisotropic etch (e.g., a reactive ion etch (ME), neutral beam etch (NBE), deep reactive ion etch (DRIE), and the like, or combinations thereof) which selectively etches the exposed portions of layers in the vertical direction.

Figure 11:
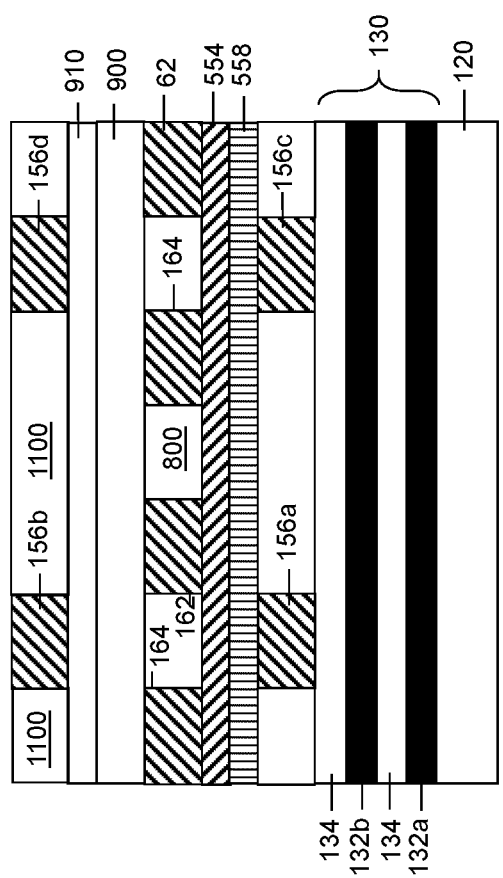

Referring to FIG. 11, an isolation dielectric 1100 is formed between the second and fourth gate electrodes 156b and 156d. A dielectric material is deposited on the second and fourth gate electrodes 156b and 156d. The dielectric material may be formed by depositing isolation materials (e.g., SiO, $SiO_2$ or $SiO_xN_y$). After the dielectric material is deposited, a top portion of the dielectric material may be polished by using, e.g., chemical-mechanical polishing (CMP) to flatten a top surface of the semiconductor device including the isolation dielectric and the second and fourth gate electrodes 156b and 156d, and to remove the dielectric material from the top of the second and fourth gate electrodes 156b and 156d.

Figure 12:
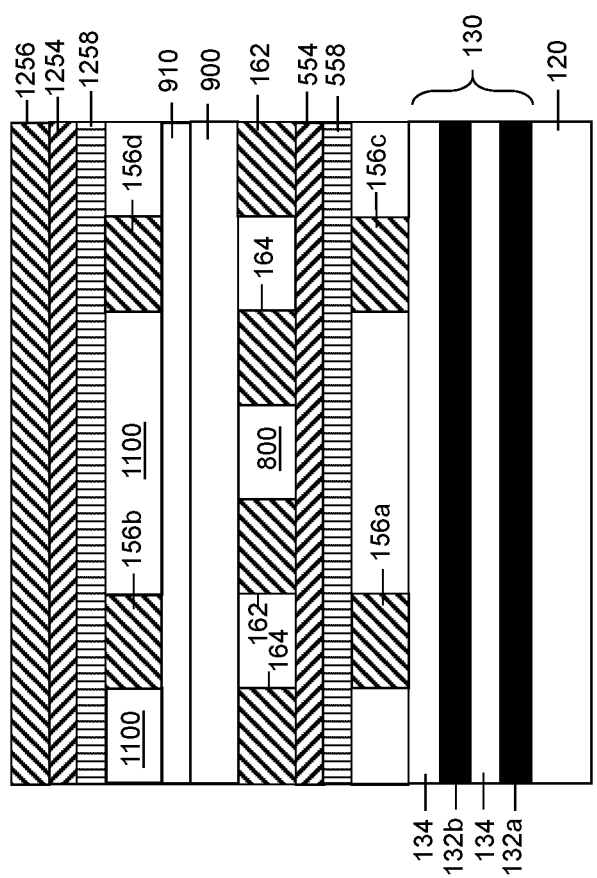

Referring to FIG. 12, a gate dielectric layer 1258 is formed over the second and fourth gate electrodes 156b and 156d. A channel layer 1254 is formed on the gate dielectric layer 1258.

The gate dielectric layer 1258 may be, for example, a high-k dielectric. The high-k dielectric can be any type of material that has a relatively large dielectric constant (e.g., having a dielectric constant greater than 3.9). The high-k dielectric material may be, for example, silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof.

The high-k dielectric material may be grown by thermal oxidization (e.g., annealing). In some embodiments, the high-k dielectric material may be deposited as a blanket layer over the semiconductor device 100. For example, the high-k dielectric material may cover a top surface of the gate electrodes 156b and 156d and the isolation dielectric 400. The high-k dielectric material may be deposited as a blanket layer using any of the methods of atomic layer deposition (ALD), chemical vapor deposition (CVD), physical vapor deposition (PVD), evaporation, electrodeposition, sputtering, plasma-enhanced techniques, etc.

The channel layer 1254 may be a 2D semiconductor material, or an oxide semiconductor, for example. The 2D material may be, for example, at least one of $WS_2$, $WSe_2$, $WTe_2$, $MoS_2$, $MoSe_2$, $MoTe_2$, $HfS_2$, $ZrS_2$, $TiS_2$, GaSe, InSe, phosphorene, graphene, HBN, $HfSe_2$, $ZrSe_2$, or $HfZrSe_2$. The 2D material may be formed by, for example, ALD, CVD, PVD, evaporation, electrodeposition, sputtering, plasma-enhanced techniques, etc. The deposited 2D material may be, for example, about 5 to about 15 angstroms thick, the thinness lending to their name—2D material. The materials may be annealed during or after the device formation process to recrystallize or grow the crystals and thereby improve electrical characteristics. For the sake of simplicity, the use of conductive dielectrics will be disclosed. An annealing may be included to set the 2D material as appropriate for an NMOS device or a PMOS device.

The oxide semiconductor material may be, for example, $In_2O_3$. The oxide semiconductor material may be formed by, for example, ALD, CVD, PVD, evaporation, electrodeposition, sputtering, plasma-enhanced techniques, etc.

The source/drain layer 1256 may be any type of conductive metal suitable to form a source or drain electrode in the semiconductor device 100, including copper, gold, silver, platinum, nickel, tungsten, ruthenium, or other types of conductive metals or alloys. The deposition or addition of the source/drain layer may be performed using any type of material deposition technique, including but not limited to ALD, CVD, physical vapor deposition (PVD), evaporation, electrodeposition, and sputtering.

Thus the second gate electrode 156b and fourth gate electrode 156d may be aligned with the channel layer 1254.

Figure 13:
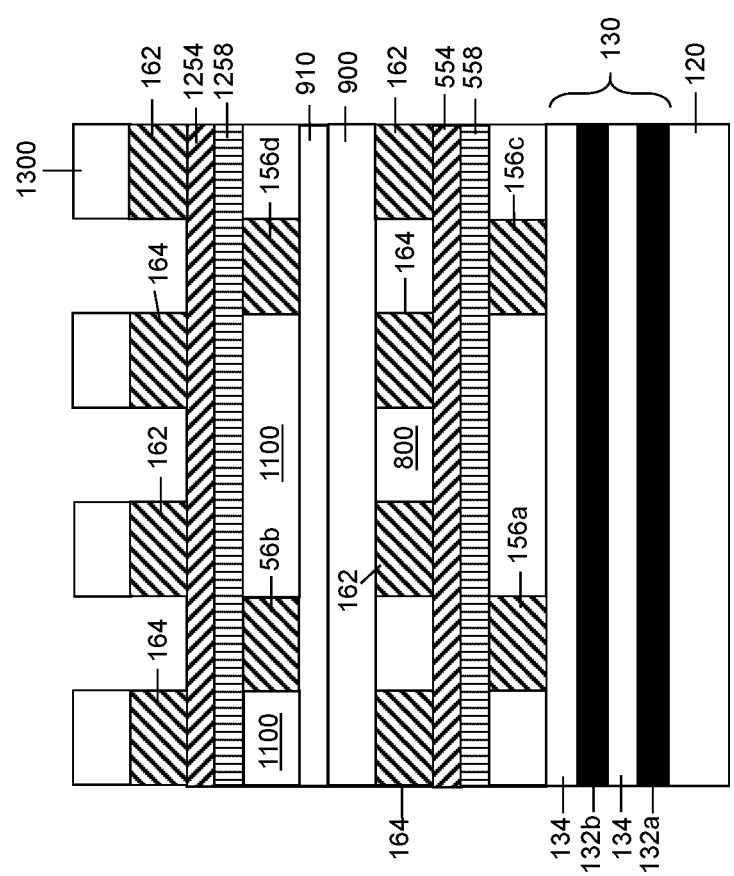

Referring to FIG. 13, a photoresist mask 1300 is formed on the source/drain layer 1256. Patterning of the source/drain layer 1256 may be performed by, for example, a photolithographic process. Photoresist (e.g., a positive photoresist or a negative photoresist), for example, may be deposited on the source/drain layer 1256. The photoresist is irradiated with light and developed to form a photoresist mask 1300 over the source/drain layer 1256.

The source/drain layer 1256 is then etched to form the source contacts 162 and drain contacts 164, In some embodiments, etching may be an anisotropic etch (e.g., a reactive ion etch (ME), neutral beam etch (NBE), deep reactive ion etch (DRIE), and the like, or combinations thereof) which selectively etches the exposed portions of layers in the vertical direction. The etching exposes the channel layer 1254. The photoresist mask 1300 may then be removed.

Figure 14:
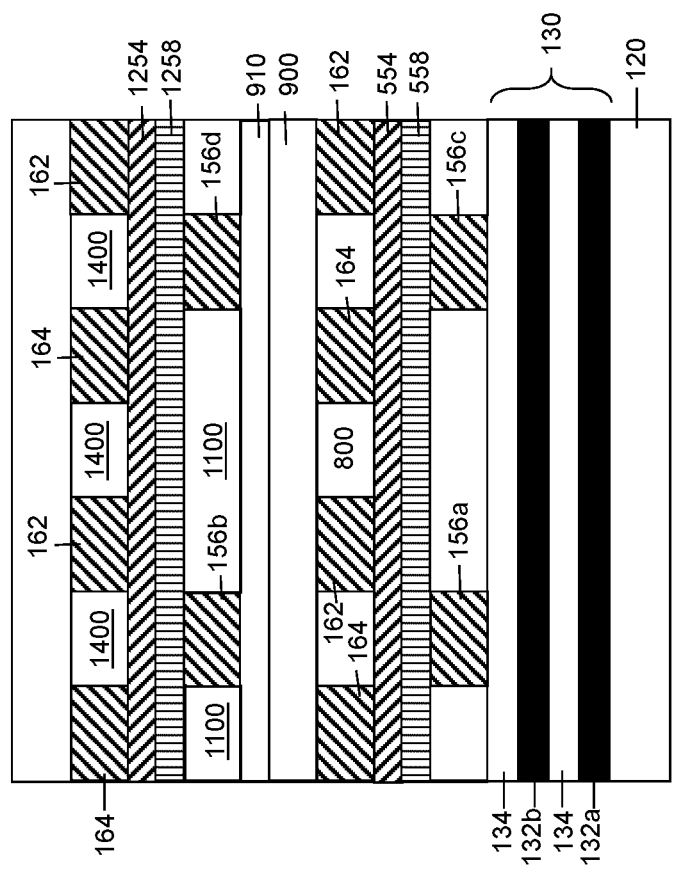

Referring to FIG. 14, a dielectric 1400 is formed between the source contacts 162 and drain contacts 164. A dielectric material is deposited on the source contacts 162 and drain contacts 164. The dielectric material may be formed by depositing isolation materials (e.g., SiO, $SiO_2$ or $SiO_xN_y$). After the dielectric material is deposited, a top portion of the dielectric material may be polished by using, e.g., (CMP) to flatten a top surface of the semiconductor device including the dielectric 1400 and the source contacts 162 and drain contacts 164, and to remove the dielectric material from the top of the source contacts 162 and drain contacts 164.

An isolation dielectric layer 1410 is formed on the dielectric 1400 and on the source contacts 162 and drain contacts 164. A dielectric material is deposited on the dielectric 1400 and on the source contacts 162 and drain contacts 164. The dielectric material may be formed by depositing isolation materials (e.g., SiO, $SiO_2$ or $SiO_xN_y$).

Figure 15:
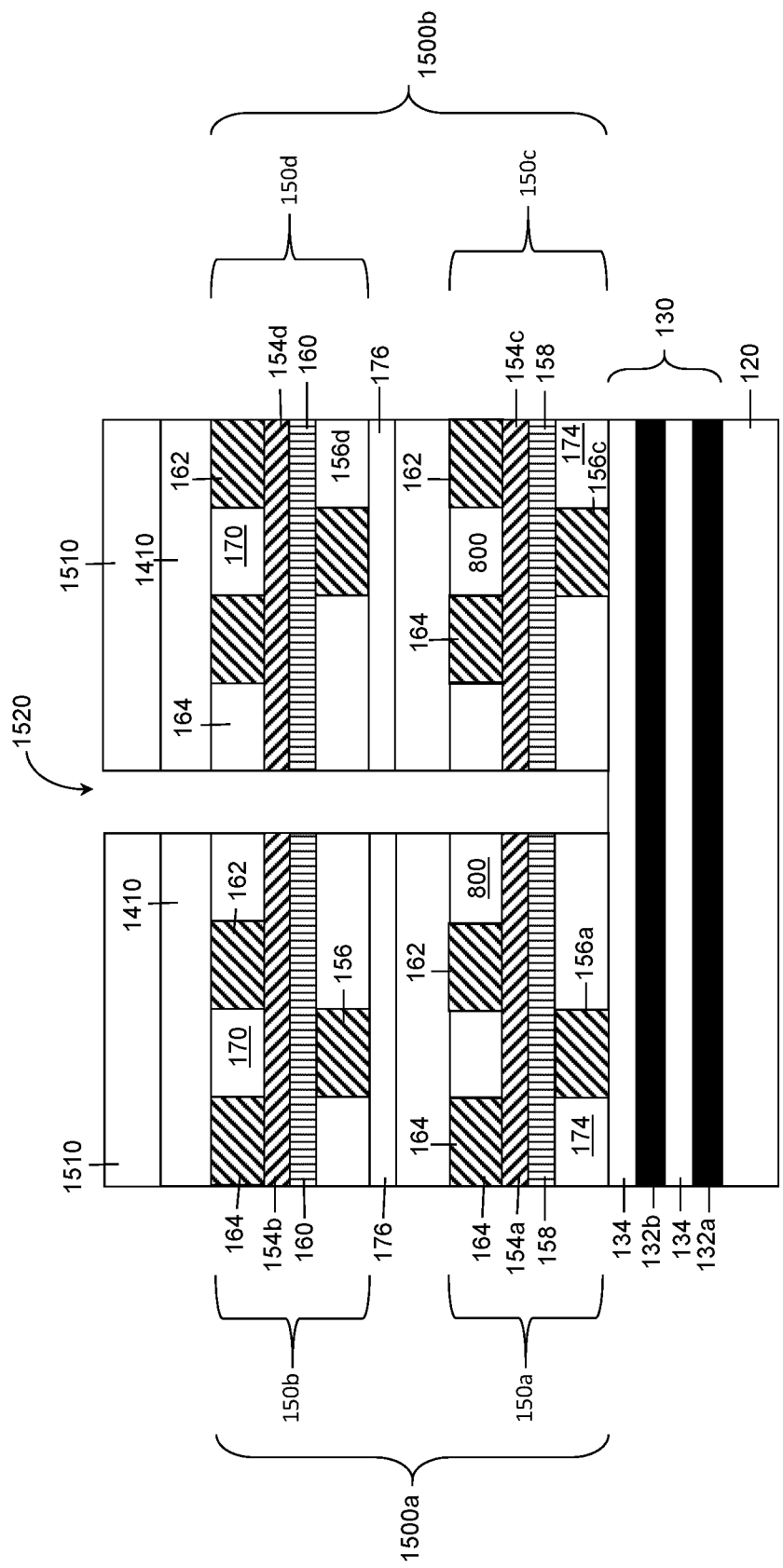

Referring to FIG. 15, the device is processed to separate the first transistor 150a and second transistor 150b (collectively the first CFET 1500a), from the third transistor 150c and fourth transistor 150d (collectively the second CFET 1500b). A photoresist mask 1510 is formed on the isolation dielectric 1410. Photoresist (e.g., a positive photoresist or a negative photoresist), for example, may be deposited on the isolation dielectric 1410. The photoresist is irradiated with light and developed to form the photoresist mask 1510 over the isolation dielectric 1410.

The device 100 is then etched to form a recess 1520 extending from a top of the device 100 to the base wiring 130. The recess 1520 separates the first CFET 1500a from the second CFET 1500b. In some embodiments, etching may be an anisotropic etch (e.g., a reactive ion etch (RIE), neutral beam etch (NBE), deep reactive ion etch (DRIE), and the like, or combinations thereof) which selectively etches the exposed portions of layers in the vertical direction.

Figure 16:
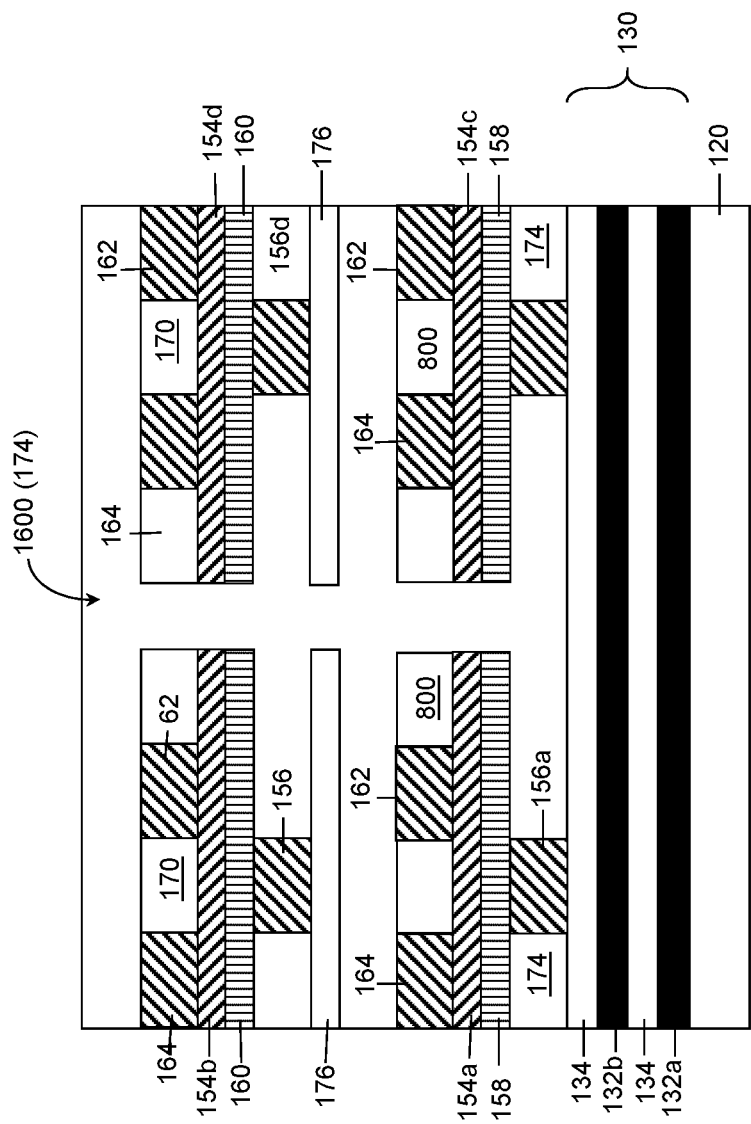

Referring to FIG. 16, an isolation dielectric 1600 is formed in the recess 1520 and over the device 100. A dielectric material is deposited in the recess 1520 and over the device 100. The dielectric material may be formed by depositing isolation materials (e.g., SiO, $SiO_2$ or $SiO_xN_y$). After the dielectric material is deposited, a top portion of the dielectric material may be polished by using, e.g., CMP to flatten a top surface of the semiconductor device including the isolation dielectric 1600.

Figure 17:
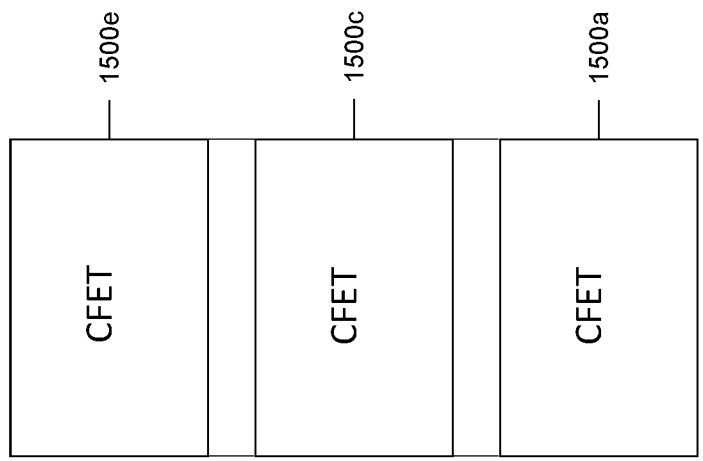
FIG. 17 is a schematic illustrating a semiconductor device with a stacked CFET structure, in accordance with some embodiments.

Referring to FIG. 17, a device with stacked CFETs is illustrated. The device includes CFETs 1500a, 1500c and 1500e. The CFETs may be formed to have stacked vertical structures including N CFETs, where N is an integer of two or more.

Although not shown, there may be additional steps before, during, and/or after the steps discussed with respect to FIGS. 2-16. For example, there may be interconnect structures formed that connect the gate metal and/or the source/drain contacts to other semiconductor devices.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method for manufacturing a semiconductor device, comprising:
    forming a first complementary field effect transistor structure comprising:
        forming a first transistor structure of a first conductivity type, the first transistor structure including a first gate electrode, first source/drain contacts, and a first channel, wherein the first channel is disposed above the first gate electrode and disposed below the first source/drain contacts, and wherein the first channel laterally extends from one of the first source/drain contacts to the other of the first source/drain contacts and over the first gate electrode, with ends of the first channel aligned with the first source/drain contacts, respectively; and
        forming a second transistor structure of a second conductivity type, the second transistor structure including a second gate electrode, second source/drain contacts, and a second channel, wherein the second channel is disposed above the second gate electrode and disposed below the second source/drain contacts, and wherein the second channel laterally extends from one of the second source/drain contacts to the other of the second source/drain contacts and over the second gate electrode, with ends of the second channel aligned with the second source/drain contacts, respectively,
    wherein at least one of the first channel or the second channel includes a two-dimensional semiconductor material or an oxide semiconductor.

2. The method of claim 1, further comprising forming a first gate dielectric on the first gate electrode and a second gate dielectric on the second gate electrode.

3. The method of claim 1, wherein the first channel includes a two-dimensional semiconductor material, and the second channel includes a two-dimensional semiconductor material.

4. The method of claim 1, wherein the first channel includes an oxide semiconductor, and the second channel includes an oxide semiconductor.

5. The method of claim 1, wherein the first channel includes an oxide semiconductor, and the second channel includes a two-dimensional semiconductor material.

6. The method of claim 1, further comprising forming a second complementary field effect transistor structure disposed vertically from the first complementary field effect transistor structure, wherein forming the second complementary field effect transistor structure comprises:
    forming a third transistor structure of the first conductivity type above the first transistor structure, the first transistor structure including a third gate electrode, third source/drain contacts, and a third channel, wherein the third channel is disposed above the third gate electrode and disposed below the third source/drain contacts; and
    forming a fourth transistor structure of the second conductivity type above the second transistor structure, the fourth transistor structure including a fourth gate electrode, fourth source/drain contacts, and a fourth channel, wherein the fourth channel is disposed above the fourth gate electrode and disposed below the fourth source/drain contacts.

7. The method of claim 1, further comprising forming a second complementary field effect transistor structure disposed horizontally from the first complementary field effect transistor structure, wherein forming the second complementary field effect transistor structure comprises:
    forming a third transistor structure of the first conductivity type, the first transistor structure including a third gate electrode, third source/drain contacts, and a third channel, wherein the third channel is disposed above the third gate electrode and dispose below the third source/drain contacts; and
    forming a fourth transistor structure of the second conductivity type above the third transistor structure, the fourth transistor structure including a fourth gate electrode, fourth source/drain contacts, and a fourth channel, wherein the fourth channel is disposed above the fourth gate electrode and disposed below the fourth source/drain contacts.

8. The method of claim 1, wherein the two-dimensional semiconductor material includes at least one of $WS_2$, $WSe_2$, $WTe_2$, $MoS_2$, $MoSe_2$, $MoTe_2$, $HfS_2$, $ZrS_2$, $TiS_2$, GaSe, InSe, phosphorene, graphene, HBN, $HfSe_2$, $ZrSe_2$, or $HfZrSe_2$.

9. The method of claim 1, further comprising forming buried power rails, wherein the first gate electrode is formed above the buried power rails.

10. The method of claim 1, wherein the oxide semiconductor includes $In_2O_3$, $SnO_2$, InGaZnO, ZnO, or SnO.

11. A method for manufacturing a semiconductor device, comprising:
    forming a first gate electrode;
    forming a first gate dielectric above the first gate electrode, wherein the first gate dielectric laterally extends over the first gate electrode;
    forming a first channel above the first gate dielectric, wherein the first channel includes a two-dimensional semiconductor material or an oxide semiconductor and laterally extends over the first gate electrode;
    forming a first source contact and a first drain contact, wherein a whole of each of the first source contact and the first drain contact is disposed above the first channel;
    forming a dielectric above the first source contact the first drain contact;
    forming a second gate electrode above the dielectric;
    forming a second gate dielectric above the second gate electrode, wherein the second gate dielectric laterally extends over the second gate electrode;
    forming a second channel above the second gate dielectric, wherein the second channel includes a two-dimensional semiconductor material or an oxide semiconductor and laterally extends over the second gate electrode; and forming a second source contact and a second drain contact, wherein a whole of each of the second source contact and the second drain contact is disposed above the second channel.

12. The method of claim 11, further comprising forming a dielectric cap layer above the dielectric, wherein the second gate electrode is formed on the dielectric cap layer.

13. The method of claim 11, further comprising:
forming a third gate electrode above the second source contact and the second drain contact;
forming a third gate dielectric above the third gate electrode, wherein the third gate dielectric laterally extends over the third gate electrode;
forming a third channel above the third gate dielectric, wherein the third channel includes a two-dimensional semiconductor material or an oxide semiconductor and laterally extends over the third gate electrode;
forming a third source contact and a third drain contact, wherein a whole of each of the third source contact and the third drain contact is disposed above the third channel;
forming a second dielectric above the third source contact the third drain contact;
forming a fourth gate electrode above the second dielectric;
forming a fourth gate dielectric above the fourth gate electrode, wherein the fourth gate dielectric laterally extends over the fourth gate electrode;
forming a fourth channel above the fourth gate dielectric, wherein the fourth channel includes a two-dimensional semiconductor material or an oxide semiconductor and laterally extends over the fourth gate electrode; and
forming a fourth source contact and a fourth drain contact, wherein a whole of each of the fourth source contact and the fourth drain contact is disposed above the fourth channel.

14. The method of claim 11, further comprising:
forming a third gate electrode planar with the first gate electrode, wherein the first gate dielectric laterally extends over the third gate electrode;
forming a third source contact and a third drain contact above the first channel, wherein a whole of each of the third source contact and the third drain contact is disposed above the first channel;
forming a fourth gate electrode planar with the second gate electrode above the dielectric; and
forming a fourth source contact and a fourth drain contact above the second channel, wherein a whole of each of the fourth source contact and the fourth drain contact is disposed above the second channel.

15. A method for manufacturing a semiconductor device, comprising:
forming a first gate electrode;
forming a first gate dielectric above the first gate electrode, wherein the first gate dielectric laterally extends over the first gate electrode;
forming a first channel above the first gate dielectric, wherein the first channel includes a two-dimensional semiconductor material or an oxide semiconductor and laterally extends over the first gate electrode;

forming a first source contact and a first drain contact above the first channel, wherein the first source contact and the first drain contact are disposed on both sides of the first gate electrode, respectively;

forming a dielectric above the first source contact the first drain contact;

forming a second gate electrode above the dielectric;

forming a second gate dielectric above the second gate electrode, wherein the second gate dielectric laterally extends over the second gate electrode;

forming a second channel above the second gate dielectric, wherein the second channel includes a two-dimensional semiconductor material or an oxide semiconductor and laterally extends over the second gate electrode; and forming a second source contact and a second drain contact above the second channel, wherein the second source contact and the second drain contact are disposed on both sides of the second gate electrode, respectively.

16. The method of claim 15, wherein a whole of each of the first source contact and the first drain contact is disposed above the first channel.

17. The method of claim 15, wherein a whole of each of the third source contact and the third drain contact is disposed above the third channel.

18. The method of claim 15, further comprising:
forming a third gate electrode laterally apart from the first gate electrode, wherein the first gate dielectric laterally extends over both of the first gate electrode and the third gate electrode, and wherein the first channel laterally extends over both of the first gate electrode and the third gate electrode;
forming a third source contact and a third drain contact above the first channel, wherein the third source contact and the third drain contact are disposed on both sides of the third gate electrode, respectively.

19. The method of claim 18, further comprising:
forming a fourth gate electrode laterally apart from the second gate electrode, wherein the second gate dielectric laterally extends over both of the second gate electrode and the fourth gate electrode, and wherein the second channel laterally extends over both of the second gate electrode and the fourth gate electrode;
forming a fourth source contact and a fourth drain contact above the second channel, wherein the fourth source contact and the fourth drain contact are disposed on both sides of the fourth gate electrode, respectively.

20. The method of claim 19, wherein a whole of each of the third source contact and the third drain contact is disposed above the first channel, and a whole of each of the fourth source contact and the fourth drain contact is disposed above the second channel.

* * * * *